United States Patent
Oboukhov et al.

(10) Patent No.: US 11,811,425 B2
(45) Date of Patent: Nov. 7, 2023

(54) NEURAL NETWORK SOFT INFORMATION DETECTOR IN A READ CHANNEL

(71) Applicant: Western Digital Technologies, Inc., San Jose, CA (US)

(72) Inventors: Iouri Oboukhov, Rochester, MN (US); Daniel Bedau, San Jose, CA (US); Richard Galbraith, Rochester, MN (US); Niranjay Ravindran, Rochester, MN (US); Weldon Hanson, Rochester, MN (US); Pradhan Bellam, Rochester, MN (US)

(73) Assignee: Western Digital Technologies, Inc., San Jose, CA (US)

( * ) Notice: Subject to any disclaimer, the term of this patent is extended or adjusted under 35 U.S.C. 154(b) by 30 days.

(21) Appl. No.: 17/480,301

(22) Filed: Sep. 21, 2021

(65) Prior Publication Data

US 2022/0376711 A1 Nov. 24, 2022

Related U.S. Application Data

(60) Provisional application No. 63/189,883, filed on May 18, 2021.

(51) Int. Cl.
*H03M 13/41* (2006.01)
*H03M 13/37* (2006.01)
*H04L 1/00* (2006.01)
*G06N 3/04* (2023.01)
*G06N 7/01* (2023.01)

(52) U.S. Cl.
CPC ... *H03M 13/4138* (2013.01); *H03M 13/3746* (2013.01); *G06N 3/04* (2013.01); *G06N 7/01* (2023.01); *H04L 1/005* (2013.01)

(58) Field of Classification Search
CPC .............. H03M 13/4138; H03M 13/3746
See application file for complete search history.

(56) References Cited

U.S. PATENT DOCUMENTS 5,361,327 A * 11/1994 Takahashi ......... H04L 25/03165
5,381,359 A    1/1995 Abbott et al.
(Continued)

FOREIGN PATENT DOCUMENTS

CN    107291382    10/2017

OTHER PUBLICATIONS

Cognimem Technologies, Inc., "CogniMem Technologies, Inc., Cognitive Computing, Pattern Recognition Chip Company," retrieved from www.cognimem.com on Oct. 23, 2018, 3 pgs.
(Continued)

*Primary Examiner* — Joseph D Torres
(74) *Attorney, Agent, or Firm* — PATENT LAW WORKS LLP

(57) ABSTRACT

Example systems, read channels, and methods provide bit value detection from an encoded data signal using a neural network soft information detector. The neural network detector determines a set of probabilities for possible states of a data symbol from the encoded data signal. A soft output detector uses the set of probabilities for possible states of the data symbol to determine a set of bit probabilities that are iteratively exchanged as extrinsic information with an iterative decoder for making decoding decisions. The iterative decoder outputs decoded bit values for a data unit that includes the data symbol.

22 Claims, 10 Drawing Sheets

(56) References Cited

U.S. PATENT DOCUMENTS

| | | | |
|---|---|---|---|
| 5,594,597 | A | 1/1997 | Padden |
| 5,610,776 | A | 3/1997 | Oh |
| 5,699,487 | A | 12/1997 | Richardson |
| 5,978,782 | A | 11/1999 | Neely |
| 6,043,946 | A | 3/2000 | Genheimer et al. |
| 6,052,349 | A | 4/2000 | Okamoto |
| 6,384,995 | B1 | 5/2002 | Smith |
| 6,862,152 | B2 | 3/2005 | Wu et al. |
| 7,089,483 | B2 | 8/2006 | McEwen et al. |
| 7,502,766 | B2 | 3/2009 | Dodgson |
| 7,558,012 | B2 | 7/2009 | Lee |
| 8,995,074 | B1 | 3/2015 | Low |
| 9,047,205 | B1 | 6/2015 | Chen et al. |
| 9,516,237 | B1 | 12/2016 | Goyal et al. |
| 9,619,379 | B1 | 4/2017 | Chan et al. |
| 9,761,273 | B1 | 9/2017 | Chen |
| 10,056,920 | B1 | 8/2018 | Chen et al. |
| 10,063,257 | B1 | 8/2018 | Chen |
| 10,802,728 | B2 | 10/2020 | Lee et al. |
| 2003/0152175 | A1 | 8/2003 | Kuki et al. |
| 2004/0268208 | A1 | 12/2004 | Radich |
| 2007/0044000 | A1 | 2/2007 | Shen et al. |
| 2010/0185914 | A1 | 7/2010 | Tan et al. |
| 2014/0363143 | A1 | 12/2014 | Dharssi et al. |
| 2015/0332127 | A1 | 11/2015 | Zheng et al. |
| 2016/0063273 | A1 | 3/2016 | Wong et al. |
| 2017/0148482 | A1 | 5/2017 | Wu et al. |
| 2019/0204088 | A1* | 7/2019 | Haque .................... G06N 5/027 |
| 2019/0385094 | A1* | 12/2019 | Alex ...................... G06N 20/20 |
| 2020/0099401 | A1* | 3/2020 | Qin .......................... G06N 3/08 |
| 2020/0151539 | A1 | 5/2020 | Oh et al. |
| 2020/0389188 | A1* | 12/2020 | Belzer ............... H03M 13/6343 |

OTHER PUBLICATIONS

Galbraith et al., "Iterative Detection Read Channel Technology in Hard Disk Drives," Nov. 2008, 8 pgs., retrieved from https://www.hgst.com/sites/default/files/resources/IDRC_WP_final.pdf.

Gupta et al., "ProtoNN: Compressed and Accurate kNN for Resource-scarce Devices," Proceedings of the 34th International Conference on Machine Learning, PLMR 70, Sydney, Australia, Aug. 6-11, 2017, 16 pgs.

Nguyen et al., Abstract of "Joint network coding and machine learning for error-prone wireless broadcast," 2017 IEEE 7th Annual Computing and Communication Workshop and Conference (CCWC), Las Vegas, Nevada, Jan. 9-11, 2017, 3 pgs., doi: 10.1109/CCWC.2017.7868415, available online at http://ieeexplore.ieee.org/document/7868415/.

Park et al., Abstract of "Prediction of information propagation in a drone network by using machine learning," 2016 International Conference on Information and Communication Technology Convergence (ICTC), Jeju Island, Korea, Oct. 19-21, 2016, 3 pgs., doi: 10.1109/ICTC.2016.7763456, available online at http://ieeexplore.ieee.org/document/7763456/.

Pedregosa et al., "Scikit-learn: Machine Learning in Python," Journal of Machine Learning Research, 12 (2011), Oct. 2011, pp. 2825-2830.

Qin et al. "Deep Neural Network: Data Detection Channel for Hard Disk Drives by Learning," IEEE Transactions on Magnetics, vol. 56, No. 2, Feb. 2020, 8 pgs.

Robb, "Top 10 AI and Machine Learning Data Storage Trends," Enterprise Storage Forum, May 4, 2017, available online at https://www.enterprisestorageforum.com/management/top-10-ai-and-machine-learning-data-storage-trends/, May 4, 2017, 3 pgs.

Sayyafan et al., "Deep Neural Network Media Noise Predictor Turbo-Detection System for 1-D and 2-D High-Density Magnetic Recording," IEEE Transactions on Magnetics, vol. 57, No. 3, Oct. 2020, 13 pgs.

Shen et al., "Deep Neural Network a Posterior Probability Detector for Two-dimensional Magnetic Recording," IEEE Transactions on Magnetics, vol. 56, No. 6, Jun. 2020, 12 pgs.

Wikipedia, "Viterbi algorithm," Wikimedia Foundation, available online at https://en.wikipedia.org/w/index.php?title=Viterbi_algorithm&oldid=84 . . . , edited Jan. 26, 2002, 4 pgs.

* cited by examiner

NEURAL NETWORK SOFT INFORMATION DETECTOR IN A READ CHANNEL

TECHNICAL FIELD

The present disclosure relates to data detection. In particular, the present disclosure relates to improved read channel data detection using machine learning.

BACKGROUND

In present-day data transmission and storage mediums, such as disk, tape, optical, mechanical, and solid-state storage drives, data detection is based in large part on techniques developed in the early years of the data storage industry. While recently developed read channels invoke relatively new data encoding and detection schemes such as iterative detection and low-density parity codes (LDPC), much of the signal processing power in today's read channels is still based on partial-response maximum-likely-hood detection (PRML), developed in the early 1990's. Iterative LDPC code detectors use successive iterations and calculated reliability values to arrive at the most likely value for each bit. Soft information may be calculated for each bit and is sometimes represented by a log likelihood ratio (LLR) value, which is the natural logarithm of the ratio of the probability that the bit is a 1 divided by the probability that the bit is a 0. In some configurations a soft output Viterbi algorithm (SOVA) detector that determines LLR values for each bit may be paired with an iterative decoder for determining bias values for the next iteration of the S OVA. For example, a SOVA detector may be paired with an LDPC detector that receives bit LLR values, returns extrinsic LLR values, and outputs hard decisions when LDPC constraints are met.

There is a need for technology that efficiently improves error rate performance of read channels in data transmission and/or storage devices.

SUMMARY

Various aspects for data detection from a read signal using a neural network-based soft information detector, particularly an artificial neural network (ANN) detector that determines symbol probabilities for a SOVA detector in an iterative detection loop are described.

One general aspect includes a read channel circuit including: a neural network detector, a soft output detector, and an iterative decoder. The neural network detector is configured to: receive a data symbol, where the data symbol represents at least one unknown bit; and determine a set of probabilities for possible states of the data symbol based on training to: decode an analog representation of the data symbol; perform at least one equalization operation; and reduce noise correlation. The soft output detector is configured to: receive the set of probabilities for possible states from the neural network detector to populate a decision matrix; output, based on the decision matrix, a set of bit probabilities for bits of a data unit that includes the data symbol, and iteratively calculate, based on feedback of extrinsic information, the set of bit probabilities. The iterative decoder is configured to: receive the set of bit probabilities, iteratively exchange the extrinsic information with the soft output detector, decode at least one codeword using the received set of bit probabilities, and output decoded bit values for the data unit.

Implementations may include one or more of the following features. The soft output detector may be coupled to the neural network detector and configured as a states probability machine for the neural network detector. A data storage device may include the read channel circuit.

Another general aspect includes a read channel circuit including a neural network detector and an iterative decoder. The neural network detector is configured to: receive a data symbol, where the data symbol includes a plurality of unknown bits; and determine a set of probabilities for possible states of the data symbol. The iterative decoder is configured to: iteratively calculate, based on feedback of soft information, bit values based on the set of probabilities for possible states of the data symbol; and output decoded bit values for a data unit that includes the data symbol.

Implementations may include one or more of the following features. The neural network detector may include a plurality of weight coefficients trained to decode an analog representation of the data symbol. The neural network detector may include a plurality of weight coefficients trained to perform at least one equalization operation on an analog representation of the data symbol. The neural network detector may include a plurality of weight coefficients trained to reduce noise correlation in an analog representation of the data symbol. The neural network detector may be selected from: a fully connected artificial neural network that includes at least two fully connected layers; a convolutional neural network that includes a plurality of convolutional kernels and a fully connected layer; and a recurrent neural network that includes a plurality of recurrent network kernels and a fully connected layer. The neural network detector may include a plurality of fully connected layers and at least one rectifier activation function positioned between adjacent fully connected layers of the plurality of fully connected layers. The neural network detector may include an output layer configured to output a number of probabilities for possible states equal to all possible states for the data symbol. The circuit may further include a soft output detector coupled to the neural network detector and configured to: support iterations of the iterative decoder; selectively determine, based on the set of probabilities for possible states of the data symbol, a set of bit probabilities for bits of a data unit that includes the data symbol; and iteratively exchange extrinsic information with the iterative decoder to provide feedback on soft information, where the iterative decoder is further configured to determine whether a decoding decision is reached. The soft output detector may be configured as a states probability machine for the neural network detector, the soft output detector may implement an algorithm selected from a soft output Viterbi algorithm and a BJCR algorithm, and the iterative decoder may implement low-density parity check codes. The soft output detector may be further configured to: receive the set of probabilities for possible states from the neural network detector to populate a decision matrix; output, based on the decision matrix, the set of bit probabilities for bits of the data unit that includes the data symbol; and iteratively calculate, based on the extrinsic information from the iterative decoder, the set of bit probabilities. The iterative decoder may be further configured to decode at least one codeword using the received set of bit probabilities. A data storage device may include the read channel circuit.

Still another general aspect includes a method that includes: receiving, by a neural network detector, a data symbol, where the data symbol includes a plurality of unknown bits; determining, by the neural network detector, a set of probabilities for possible states of the data symbol; iteratively calculating, by an iterative decoder and based on feedback of soft information, bit values from the set of probabilities for possible states of the data symbol; and outputting, by the iterative decoder, decoded bit values for a data unit that includes the data symbol.

Implementations may include one or more of the following features. The method may include: training the neural network detector to decode an analog representation of the data symbol; training the neural network detector to perform at least one equalization operation on an analog representation of the data symbol; and/or training the neural network detector to reduce noise correlation in an analog representation of the data symbol. The method may include: receiving, by a soft output detector and from the neural network detector, the set of probabilities for possible states of the data symbol; selectively determining, by the soft output detector, a set of bit probabilities for bits of a data unit that includes the data symbol; providing the set of bit probabilities to the iterative decoder; and iteratively exchanging, between the soft output detector and the iterative decoder, extrinsic information to provide feedback on soft information; and determining, by the iterative decoder, whether a decoding decision is reached. The method may include: populating, by the soft output detector, a decision matrix with the set of probabilities for possible states received from the neural network detector, where the set of bit probabilities provided to the iterative decoder are based on the decision matrix; and iteratively calculating, based on the extrinsic information from the iterative decoder, the set of bit probabilities.

Still another general aspect includes a system that includes means for detecting a set of probabilities for possible states of a data symbol using a neural network, the means configured to: receive the data symbol, where the data symbol represents at least one unknown bit; and determine the set of probabilities for possible states of the data symbol based on training to decode an analog representation of the data symbol, perform at least one equalization operation, and reduce noise correlation. The system also includes means for detecting a set of bit probabilities from the set of probabilities for possible states of the data symbol, the means configured to: populate a decision matrix with the set of probabilities for possible states; output, based on the decision matrix, the set of bit probabilities for bits of a data unit that includes the data symbol, and iteratively calculate, based on feedback of extrinsic information, the set of bit probabilities. The system also includes means for iteratively decoding the set of bit probabilities to decoded bit values for the data unit, the means configured to: receive the set of bit probabilities, iteratively exchange the extrinsic information with the means for detecting the set of bit probabilities, decode at least one codeword using the received set of bit probabilities, and output decoded bit values for the data unit.

The present disclosure describes various aspects of innovative technology capable of read channel data detection using an artificial neural network (ANN) detector to determine probabilities of a symbol for input into a SOVA and iterative detection loop. The ANN-based data detection provided by the technology may be applicable to a variety of computer systems, such as storage networks, storage systems, and/or signal transmission networks. The novel technology described herein includes a number of innovative technical features and advantages over prior solutions, including, but not limited to: (1) improved data detection in a storage device, (2) reduced channel complexity of a read/write channel, and (3) flexibility to be adapted to data detection and analysis in a variety of different fields.

BRIEF DESCRIPTION OF THE DRAWINGS

The techniques introduced herein are illustrated by way of example, and not by way of limitation, in the figures of the accompanying drawings in which like reference numerals are used to refer to similar elements.

DETAILED DESCRIPTION

Novel data processing technology, such as but not limited to systems, data storage devices, read channels, and methods for detecting, decoding, and/or recovering previously encoded data in a data channel, such as a data storage read channel or data transmission receiver using an ANN detector to partially detect data symbols are disclosed. While this technology is described below in the context of a particular system architecture in various cases, it should be understood that the systems and methods can be applied to other architectures and organizations of hardware.

Figure 1A:
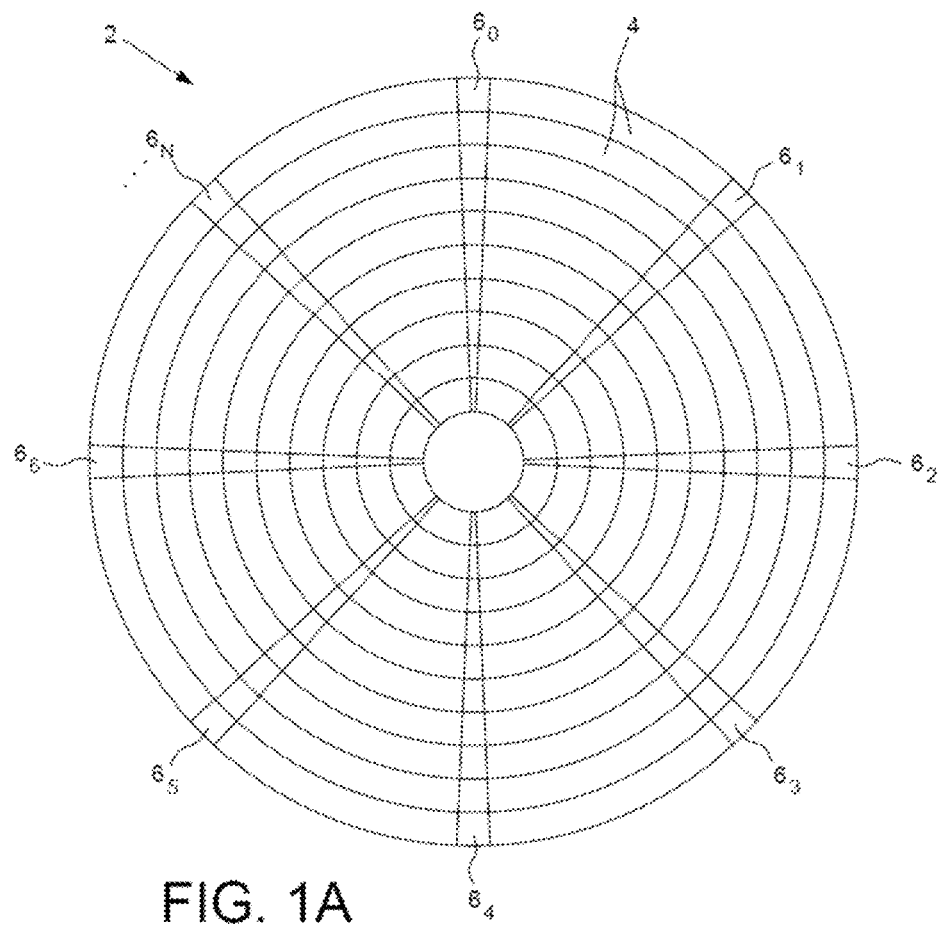
FIG. 1A is a block diagram of a prior art disk format comprising a plurality of servo tracks defined by servo sectors.
Figure 1B:
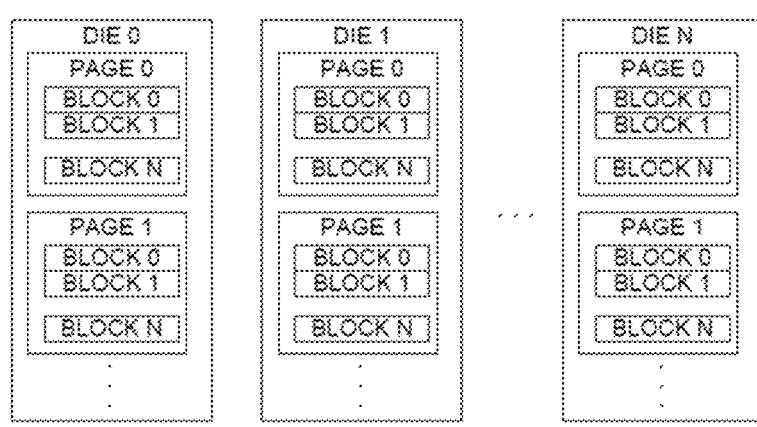
FIG. 1B is a block diagram of a prior art solid state drive format comprising a plurality of dies each comprising a plurality of pages.

In some examples, the data channel technology may be applied to a data storage read channel for recovering encoded data from a non-volatile storage medium. For example, the read channel may be incorporated in a data storage device, such as a hard disk drive (HDD), a solid-state drive (SSD), a flash drive, an optical drive, a tape drive, etc. FIG. 1A shows a prior art disk format 2 as comprising a number of servo tracks 4 defined by servo sectors $6_0$-$6_N$ recorded around the circumference of each servo track. Data tracks are defined relative to the servo tracks at the same or different radial density, wherein each data track comprises a plurality of data sectors. Each data sector may store the data symbols of a single codeword, or in other examples, each data sector may store symbols from multiple codewords (i.e., interleaved codewords). FIG. 1B shows a prior art die format for a solid state drive, wherein each die may store multiple pages and each page may store multiple blocks each corresponding to a data sector or other data unit of encoded binary data of a disk drive.

In data storage devices incorporating non-volatile storage media, such as the disk of FIG. 1A or the non-volatile memory devices of FIG. 1B, an analog read signal from the storage media may be converted into a digital bit stream by an analog-to-digital-converter (ADC) and passed to the read channel for further processing. In some examples, bit data values may be stored to a non-volatile storage medium as data blocks or other data units using one or more encoding schemes. These bit data values may be processed from the digital bit stream in windows of multiple adjacent bits and a set of adjacent bits, such as 2, 3, 5, 7, or more continuous bits from the bit stream, may be processed as a symbol for data detection and/or decoding purposes. One or more symbols may, in turn, make up one or more codewords, such as codewords selected and encoded in accordance with an error detection and/or correction scheme, such as low-density parity check (LDPC) codes. These encoded codewords may be decoded to determine decoded bit values. In some examples, the decoded bit values from these codewords may still be subject to further decoding, such as run-length limited (RLL) decoding and/or descrambling to arrive that the output data. While the description below refers to non-volatile storage medium/media (NVSM) examples, the various examples disclosed could be applied to process data read from volatile medium/media as well, as well as data signals transmitted through and/or received from a wired, wireless, or other transmission medium.

Figure 2:
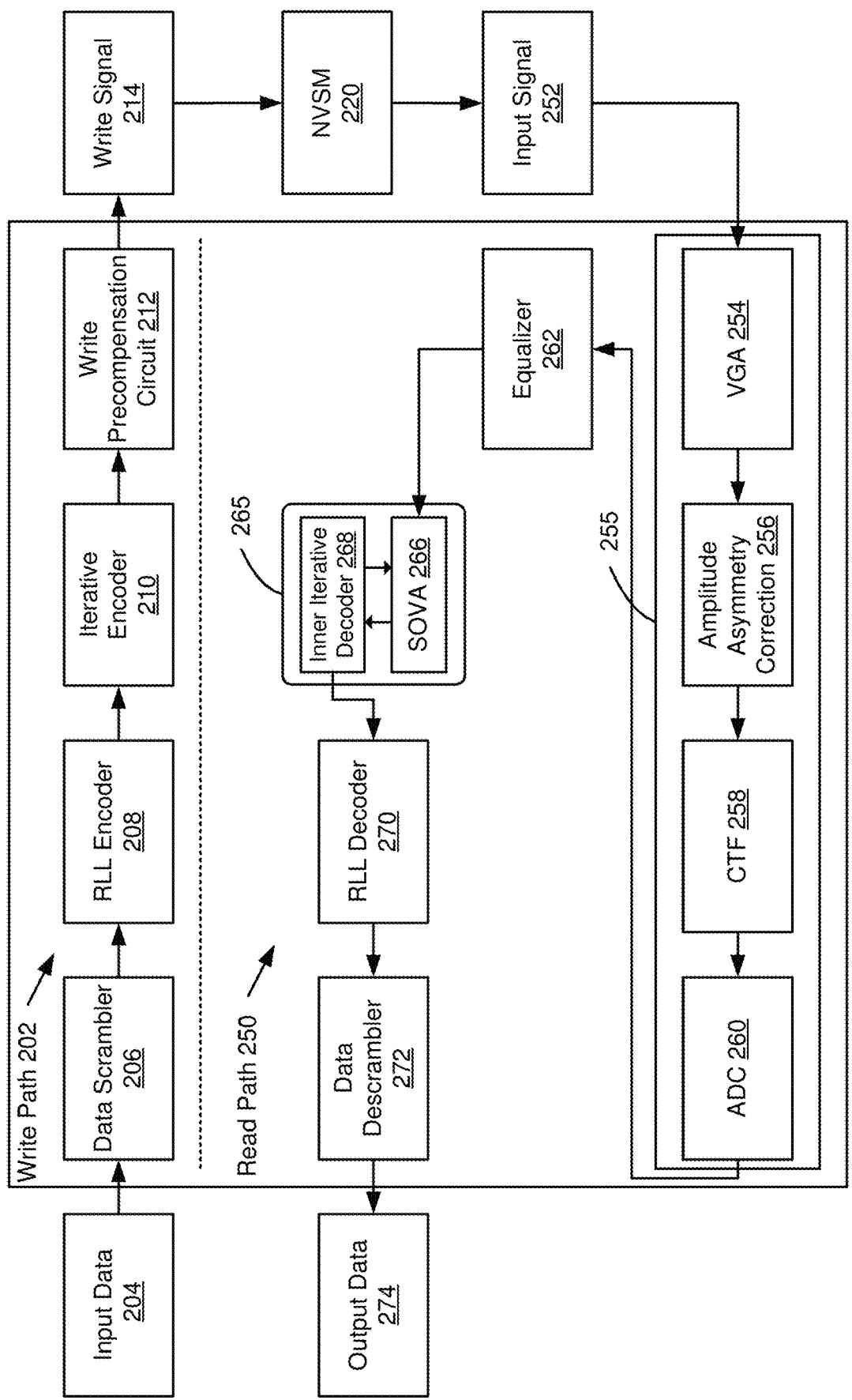
FIG. 2 is a block diagram of an existing storage system including various data processing components.

Referring to FIG. 2, a block diagram illustrating a configuration 200 comprising components employed in a known read/write path of a storage system. As illustrated, the write path 202 includes a data scrambler 206, an RLL encoder 208, an iterative encoder 210, and a write precompensation circuit 212. A write signal 214 may be output by the write path in some examples to store the resulting write bit stream to NVSM 220. Similarly, an input signal 252 may be read from NVSM 220 for processing through a read path 250. Read path 250 includes a variable gain amplifier (VGA), 254, an amplitude asymmetry correction (AAC) component 256, a continuous time filter (CTF) 258, an ADC 260, an equalizer 262, a soft output Viterbi algorithm (SOVA) 266, an inner iterative decoder 268, a RLL decoder 270, and a data descrambler 272. These component(s) receive input signals 252 as an analog read signal, and process, decode, and output the signals as output data 274, which may include decoded binary data units, such as data blocks. In some examples, these component(s) of read path 250 may comprise a read channel device or circuit.

The data scrambler 206 "randomizes" input data 204 ("whitens" the input sequence of the data) to be written into a storage media. In general, a storage system has no control over the data the user is going to write. This causes problems because it violates the assumptions that are usually made when designing storage systems, such as having independent data symbols. Since the data are not random, a frequently occurring problem is long strings of zeros in the data, which can cause difficulties in later timing recovery and adaptive equalization. These problematic sequences can be removed (or, actually, made much less likely) by introducing randomization of the input sequence for the input data 204. Therefore, during the data writing process, input data 204 may be first randomized by the data scrambler 206.

The RLL encoder 208 modulates the length of stretches in the randomized data. The RLL encoder 208 employs a line coding technique that processes arbitrary data with bandwidth limits. Specifically, the RLL encoder 208 can bound the length of stretches of repeated bits so that the stretches are not too long or too short. By modulating the data, the RLL encoder 208 can reduce the timing uncertainty in later decoding the stored data which would lead to the possible erroneous insertion of bits when reading the data back, and thus ensure the boundaries between bits can always be accurately found.

The iterative encoder 210 can append one or more parity bits to the modulated block code for later detection whether certain errors occur during data reading process. For instance, an additional binary bit (a parity bit) may be added to a string of binary bits that are moved together to ensure that the total number of "1"s in the string is even or odd. The parity bits may thus exist in two different types, an even parity in which a parity bit value is set to make the total number of "1"s in the string of bits (including the parity bit) to be an even number, and an odd parity in which a parity bit is set to make the total number of "1"s in the string of bits (including the parity bit) to be an odd number. In some examples, iterative encoder 210 may implement a linear error correcting code, such as LDPC codes or other turbo codes, to generate codewords that may be written to and more reliably recovered from NVSM 220. In some examples, iterative encoder 210 may further implement one or more single parity check codes within the codeword for recovery using soft information decoding, such as S OVA, Bahl, Cocke, Jelinek, Raviv (BCJR), or other single parity check code decoding techniques. The iterative encoder 210 may implement iterative encoding techniques to reuse the decoder architecture, thereby reducing circuit space.

The write precompensation circuit 212 can alleviate the effect of nonlinearities in the writing process. Major causes of the nonlinearities during data writing include bandwidth limitations in the write path and the demagnetizing fields in the magnetic medium for magnetic disks. These nonlinearities can cause data pattern-dependent displacements of recorded transitions relative to their nominal positions. The write precompensation circuit 212 can compensate for these data pattern-dependent displacements by introducing data pattern-dependent compensating shifts into the signals. After compensation, the information may then be written as NRZ (non-return to zero) data.

In an HDD embodiment, when reading data back from the NVSM 220, the data head of a storage drive senses the transitions (changes) in the storage medium and converts the information back into an electronic waveform. Reading analog input signal 252 from a storage medium starts at the storage medium (e.g., the drive's storage platter) and head transducer (not shown). The head transducer is located prior to the preamplifier circuit in the data read path and the head transducer output is driven by the data pattern previously written on a rotating disk. After converting into an electronic waveform, the head transducer output (e.g., input signal 252) may be further processed by the components illustrated in FIG. 2 in the read path 250 for data detection, decoding, and descrambling.

The VGA 254 amplifies the analog signal read back from the storage medium. The VGA 254 controls a signal level of the read-back analog signal based on a gain determined by an automatic gain control loop. One main function of the automatic gain control loop is to control an input signal level for optimum performance in the ADC 260. Too much gain from the VGA 254 can cause sample values in the ADC 260 to rail at maximum or minimum ADC levels, while too little gain can cause quantization noise to dominate the SNR (signal-to-noise ratio) and thus adversely affect bit error rate performance.

The AAC 256 and the CTF 258 work to linearize the amplified analog signal prior to feeding it to the ADC 260. In an HDD embodiment, the AAC 256 works to reconstruct linearity that may have been lost in the head transducer stage when the information on the storage disk is converted into an electronic signal at the output of the data head. The biasing of the head signal may in some cases be adjusted to keep the signal in the linear range of the head sensitivity curve. However, if the signal amplitude changes due to fly height or disk variation exceed the head transducer linear range, saturation in the peak or trough of the electrical head signal can occur. The AAC 256 may use signal offset to determine the amount of squared signal to add back to restore the positive and negative symmetry of the signal.

It should be noted that in practice, the read back analog signals from many different commonly used heads in existing devices cannot be linearized, regardless of the kind of biasing approach that is employed. Thus, improving data detection and recovery technology in the read channel can advantageously handle the read back signals from these types of heads because it may better compensate for nonlinear responses from the read heads.

The CTF 258 provides mid-band peaking to help attenuate high-frequency noise and minimize any aliasing that may occur when the analog signal is converted to a sampled representation. In an HDD embodiment, aliasing may not have a large effect on a drive surface's bit error rate performance. However, it can have an impact on disk drive manufacturing yields. The CTF 258 is typically a multiple pole low pass filter (e.g., a four pole Butterworth filter) with a zero available for mid-band peaking. Signal peaking can be used to emphasize frequency components, which are useful in shaping the signal to meet the digital target signal characteristic. Besides anti-aliasing, the CTF 258 may also partially equalize the data.

The ADC 260 can convert an analog signal (e.g., input signal 252), as input and/or processed by upstream components) to digital samples quantized in time and amplitude. The clock used may include the output of a digital phase-locked loop, which tracks the channel rate clock frequency. The output of the ADC may be used as feedback to control the timing of the digital phase-locked loop as well as the automatic gain control, DC baseline correction, and equalization. The VGA 254, the CTF 258, and the ADC 260, with or without the AAC 256, together may be called an analog front end 255, as the signals processed in these components are analog, while the signals in the remaining downstream components of the read path may be digital, although other variations of an analog front end 255 (which may be considered as one example form of an analog to digital convertor) may comprise software and/or hardware elements configured to convert signals from analog to digital and/or include other components for filtering, tuning, and/or processing data. In an HDD embodiment, the read channel analog front-end functions are generally similar regardless of whether the data is recorded using perpendicular or horizontal techniques.

The equalizer 262 is used for compensating for channel distortion. For example, an FIR filter may perform filtering to provide additional equalization of the signal to match signal characteristic to the desired target response for bit detection. Some equalizers may also include a noise whitening filter that further equalizes the spectrum of the signal from the FIR samples to remove noise that has non-flat amplitude spectrum. For example, the noise whitening filter may enhance low-level spectral components and attenuates high-level ones. At the output of the equalizer 262, the signal is now in a fully digital form and ready for detection of the encoded bits. The sample stream is submitted to the sequence detector (e.g., the iterative decoder 265) to begin decoding in trellises for bit recovery.

The SOVA 266 may use a Viterbi-like algorithm to decode a bit stream for bit recovery. The SOVA 266 may include a variant of the classical Viterbi algorithm. It may differ from the classical Viterbi algorithm in that it uses a modified path metric which takes into account a priori probabilities of the input symbols, and produces a soft output indicating the reliability of the decision. The SOVA 266 operates by constructing a trellis of state of probabilities and branch metrics. In some examples, SOVA 266 may be configured to detect the probabilities of bit values based on single parity check codes. Once the bit recovery is completed, parity post-processing can be performed. In some examples, an initial set bit probabilities may be provided to inner iterative decoder 268 for parity-based decoding of the codeword, initiating iterative bit detection by SOVA 266 and parity determination by inner iterative decoder 268 with the two components exchanging sets of bit probabilities as extrinsic information for reaching their maximum likelihood results and returning a decoding decision.

The inner iterative decoder 268 may help to ensure that the states at the parity block boundary satisfy the parity constraint by conducting parity error checking to determine whether data has been lost or written over during data read/write processes. It may check the parity bits appended by the iterative encoder 210 during the data writing process, and compare them with the bits recovered by the SOVA 266. Based on the setting of the iterative encoder 210 in the data writing process, each string of recovered bits may be checked to see if the "1"s total to an even or odd number for the even parity or odd parity, respectively. A parity-based post processor may also be employed to correct a specified number of the most likely error events at the output of the Viterbi-like detectors by exploiting the parity information in the coming sequence. The SOVA 266 and the inner iterative decoder 268 together may be referred to as an iterative decoder 265, as iterative decoding may exist between the two components. For example, SOVA 266 may pass detected sets of bit probabilities to inner iterative decoder 268 and inner iterative decoder 268 may use those bit probabilities to determine a most likely codeword match. If decode decision parameters are not met, inner iterative decoder 268 may feedback soft information for the set of bit probabilities to SOVA 266 as extrinsic information for further iterations of the SOVA bit detector and SOVA 266 may feed forward a new set of bit probabilities for each iteration to inner iterative decoder 268. When decode decision parameters are met, the codeword may be decoded into a set of decoded bit values for output or further processing by RLL decoder 270 and data descrambler 272.

The RLL decoder 270 may decode the run length limited codes encoded by the RLL encoder 208 during the data writing process, and the data descrambler 272 may descramble the resulting sequence, which eventually can reveal the original user data written into the storage media. The recovered or read data, output data 274, may then be sent to a requesting device, such as a host computer, network node, etc., in response to receiving the request for the data.

Artificial neural networks (ANN) are widely used in different signal/image processing applications. Regarding read channel processing, ANN has been proposed as a hard decision detector and/or replacing some or all of the processing, decoding, and recovery elements between the ADC 260 and the output data 274. Hard decision decoding appears to align with the training capabilities of ANN detectors. However, better BER improvements may be achieved through a hybrid integration of ANN detectors with soft decision making (S OVA) detectors. Soft output of an ANN detector, where the soft information represents the probability of states for a detected symbol, may be integrated with Viterbi/BCJR detector and LDPC decoder, resulting in an ANN-based soft Read Channel. In some examples, other neural network configurations, such as convolutional neural networks (CNN) and recurrent neural networks (RNN) may be similarly configured and trained to provide probability output to a soft information detector and iterative decoder.

Figure 3A:
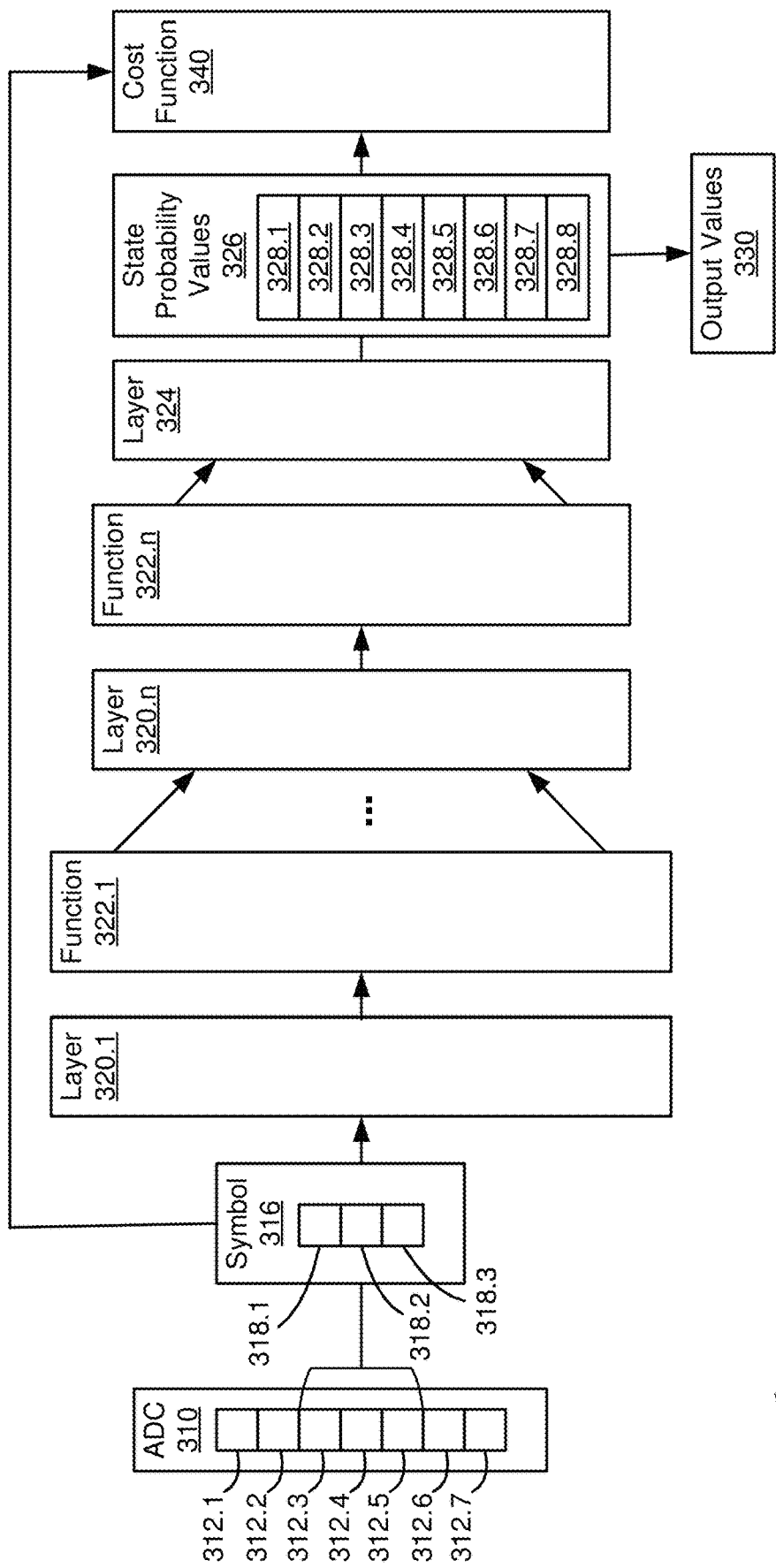
FIGS. 3A, 3B, and 3C are block diagrams of example multilayer neural network detectors.

Referring to FIG. 3A, an example multilayered ANN detector 300 is shown. An input sequence of data 312 may be determined by an ADC 310, such as ADC 260 in FIG. 2. For example, the ADC signal may include sequences of bits corresponding to a particular read operation and data unit, such as a data block. A data block or similar data unit may be comprised of a large number of bits, such as 512 or 1024 bytes of binary data, and bit detection and decoding may proceed sequentially through a digital bit stream from ADC 310. A read channel incorporating ANN detector 300 may sequentially return decoded data to a buffer configured to reconstruct the original data block. ANN detector 300 and other read channel components may operate on smaller sets of bits, such as symbols and codewords aligned with the particular detection and decoding schemes used. For example, ANN detector 300 may be configured to receive a moving window of bits from the ADC signal, such as N sequential bits that ANN detector 300 processes as symbol 316. N may be chosen for specific noise considerations, desired accuracy of the system, and/or cost/complexity of the ANN detector. In the example shown, a 7-bit sequence, including ADC bits 312.1-312.7, is received from ADC 310. Target symbol 316 may be determined by ANN detector 300 from the window of bits from ADC 310. In some examples, ANN detector 300 may process more bits than the target symbol as inputs from ADC 310. For example, due to inter symbol interference, the 3-bit ADC set directly corresponding to the target symbol may not be enough and ANN detector 300 may receive a larger number of bits (e.g., 7 ADC bits for 7 inputs for layer 320.1 of ANN detector 300). In another example, a 13-bit or larger ADC may be used and the ADC set may be input into ANN detector 300, with or without changing the N value.

In some examples, the signal from each ADC sample bit goes to ANN detector 300 and ANN detector 300 determines a symbol consisting of one or more sample bits for each probability determination operation. For example, in some configurations, a probability determination may be made for each sample bit (symbol size of 1 bit) to determine the probability of the two possible states of the symbol (1 or 0). In other configurations, the symbol size N may be 2 or greater and all possible combinations of the plurality of bits may determine the number of possible states of the symbol. For example, a symbol size of 2 would have four states (11, 10, 01, 00), a symbol size of 3 would have 8 states, a symbol size of 4 would have 16 states, a symbol size of 5 would have 32 states, etc. In some examples, a 4-bit symbol with 16 states may be preferred.

ANN detector 300 may be configured to have several fully connected (FC) layers 320, each of them followed by an activation function 322 that sends its output to the next FC layer. Any number of interim fully connected layers 320 and activation functions 322 positioned between adjacent fully connected layers may be connected in this way and conclude with a final fully connected layer 324 or output layer that generates state probability values 326. In some examples, final fully connected layer 324 does not have a corresponding activation function. Each fully connected layer may comprise a number of nodes and a corresponding set of weighted connections determined through training. In some examples, the first fully connected layer may comprise the largest number of nodes, with each sequential fully connected layer comprising fewer nodes than the prior layer until the final fully connected layer, which may have a number of nodes corresponding to the number of possible states for the symbol size N. In some examples, these weighted connections may be represented by a set of weighted parameters that are determined through training and may be stored and used by a given ANN detector and corresponding read channel for run-time data detection.

Figure 3C:
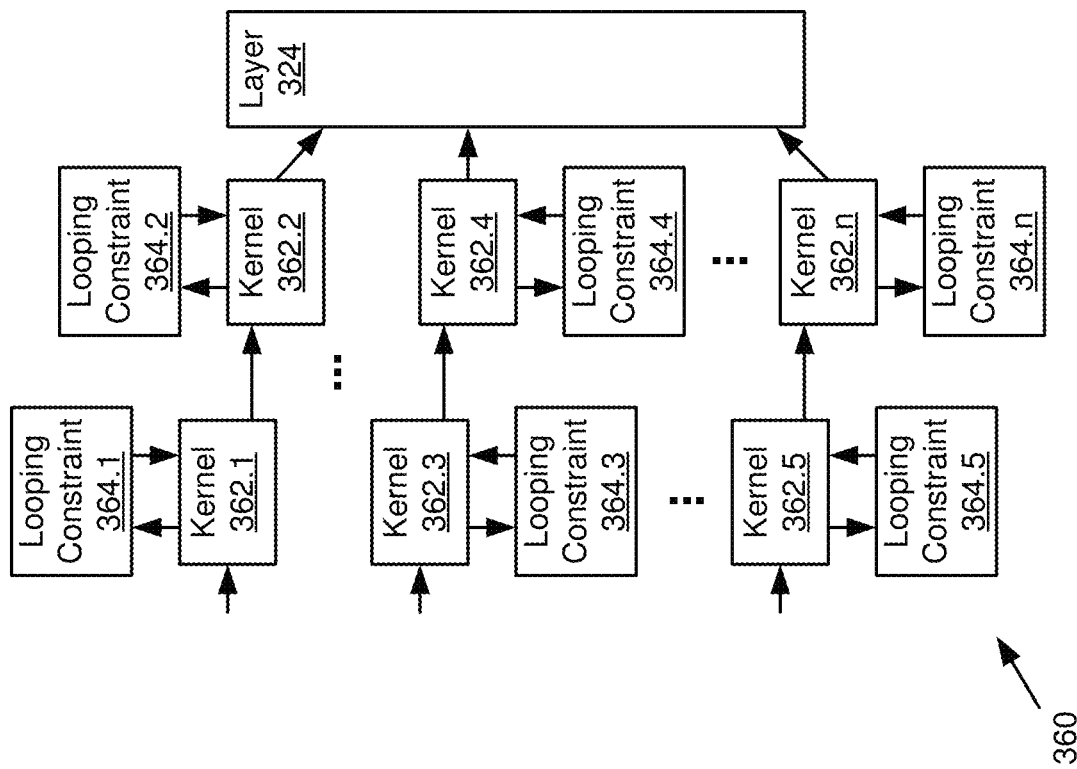
Figure 3B:
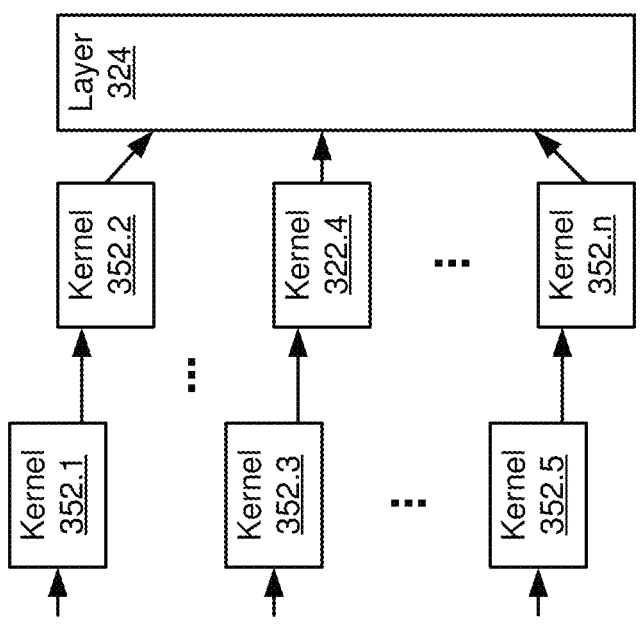

In some examples, as shown in FIG. 3B, one or more fully connected layers prior to final fully connected layer 324 may be replaced with a plurality of convolutional kernels 352.1-352.n. Convolutional kernels may define a plurality of convolutional processing paths for a convolutional neural network (CNN) 350. A CNN may include a smaller matrix of weight coefficients to reduce the memory and computation requirements of ANN detector 300. Intermediate results may be passed between sequential convolutional layers and aggregated at final fully connected layer 324 to combine all extracted features from the convolutional kernels.

In another example, as shown in FIG. 3C, one or more layers and/or kernels 362.1-362.n prior to the final fully connected layer 324 may include additional looping constraints 364.1-364.n. Looping constraints 356.1-364.n may define a plurality of recurrent processing paths through recurrent network kernels 362.1-362.n for a recurrent neural network (RNN) 360. The RNN structure may be employed with similar combination of extracted features through final fully connected layer 324. Other combinations of ANN, CNN, and RNN features and processing may be combined in a neural network detector configured and trained to determine probabilities of states for seeding a soft information detector.

In the example shown, a first FC layer 320.1 may comprise 40 nodes and a corresponding set of weighted connections (W1), a second FC layer 320.n may comprise 30 nodes and a corresponding set of weighted connections (W2), and a third and final FC layer 324 may comprise 8 nodes and a corresponding set of weighted connections (W3). Between FC layer 320.1 and FC layer 320.n, a rectified linear units (ReLU) function may be used as activation function 322.1. Between FC layer 320.n and final FC layer 324, another ReLU function may be used as activation function 322.n. The output of third and final FC layer 324 may be the set of probabilities for the possible states of symbol 316 being processed, such as state probability values 326. As discussed above, state probability values 326 may include a probability value for each possible state of symbol 316 and the number of states in the set may equal all possible states (every combination) of bit values in symbol 316. In the example shown, for detection of 3-bit symbol, state probability values 326 reflects 8 possible states 328.1-328.8 for the 3-bit sequence (000, 001, 010, 100, 110, 101, 011, 111). The foregoing multilayer ANN detector configuration is provided as an example. Other numbers of FC layers, nodes, and weighted connections, as well as other activation functions, are possible to achieve soft decision information that may be used to seed further soft information processing through a SOVA, Viterbi, BJCR, or other convolutional code algorithm and corresponding detector. In run-time or production operation of the read channel, state probability values 326 may be output as output values 330 for use in iterative decoding of one or more codewords. During training, a cost function 340 may receive state probability values 326.

Cost function 340 is used during training to determine the weight coefficients for FC layers 320.1-320.n and final FC layer 324 and evaluate the effectiveness of the training. Cost function 340 may not be used during run-time use in a read channel and, as explained elsewhere, state probability values 326 may be passed as output values 330 to other data detection and decoding components, such as a soft output detector and/or iterative decoder. Training may be based on a set of known symbol samples, where bits $b_{i-1}$, $b_i$, and $b_{i+1}$ (symbol bits 318.1-318.3) and the corresponding target state of symbol 316 are known and provided for evaluation by the cost function. The trained sequence may be chosen such that the output configuration corresponds to the desired symbol. The desired output to cost function 340 may be defined as a 1 for the correct state and 0s for all wrong states. For example, if the symbol is 000, the output of the 8 states will be 00000001; if symbol is 001, the output will be 00000010; and so on. The training on known sequences forces weight coefficients for all ANN layers to implement the function that transfer analog representation of 3-bit symbol to the signal, defining the state.

Training data sets may be based on analog bit stream data provided to and/or modeling the analog front end of the read channel. For example, a number of analog representations of the desired symbol may be provided to ADC 310 to allow ANN detector 300 to learn to correctly decode the correct symbol from varying analog representations. In some examples, training data sets for training ANN detector 300 may be selected based on different characteristics of the desired read channel configuration. For example, ANN detector 300 may be trained for a read channel that omits equalizer 262 from FIG. 2 in favor of allowing ANN detector 300 to compensate for unequalized digital bit data from ADC 260. In such a configuration, the trained ANN detector 300 would include data equalization in the neural network logic of the FC layers and weight coefficients, resulting in equalization operations being performed by ANN detector 300 and obviating the need for equalizer 262. In some examples, ANN detector 300 may also be trained to compensate for noise from the NVSM and/or analog front end. For example, ANN detector 300 may be trained for specific media configurations and the other components of the read channel may omit any other pattern-dependent noise prediction (PDNP) algorithms or compensation. This may enable simplified trellis structures used in the iterative decoding that follows ANN detector 300 in the read path. For example, the soft output detector and/or other components of the iterative decoder may not include branch metric parameters for PDNP because ANN detector 300 is trained for reducing noise correlation. Each characteristic of the read channel and the components that may be simplified or omitted may be modeled in the training data and/or use of the read channel for training ANN detector 300 to embed one or more signal or bit processing features in the neural network logic of ANN detector 300.

Figure 4:
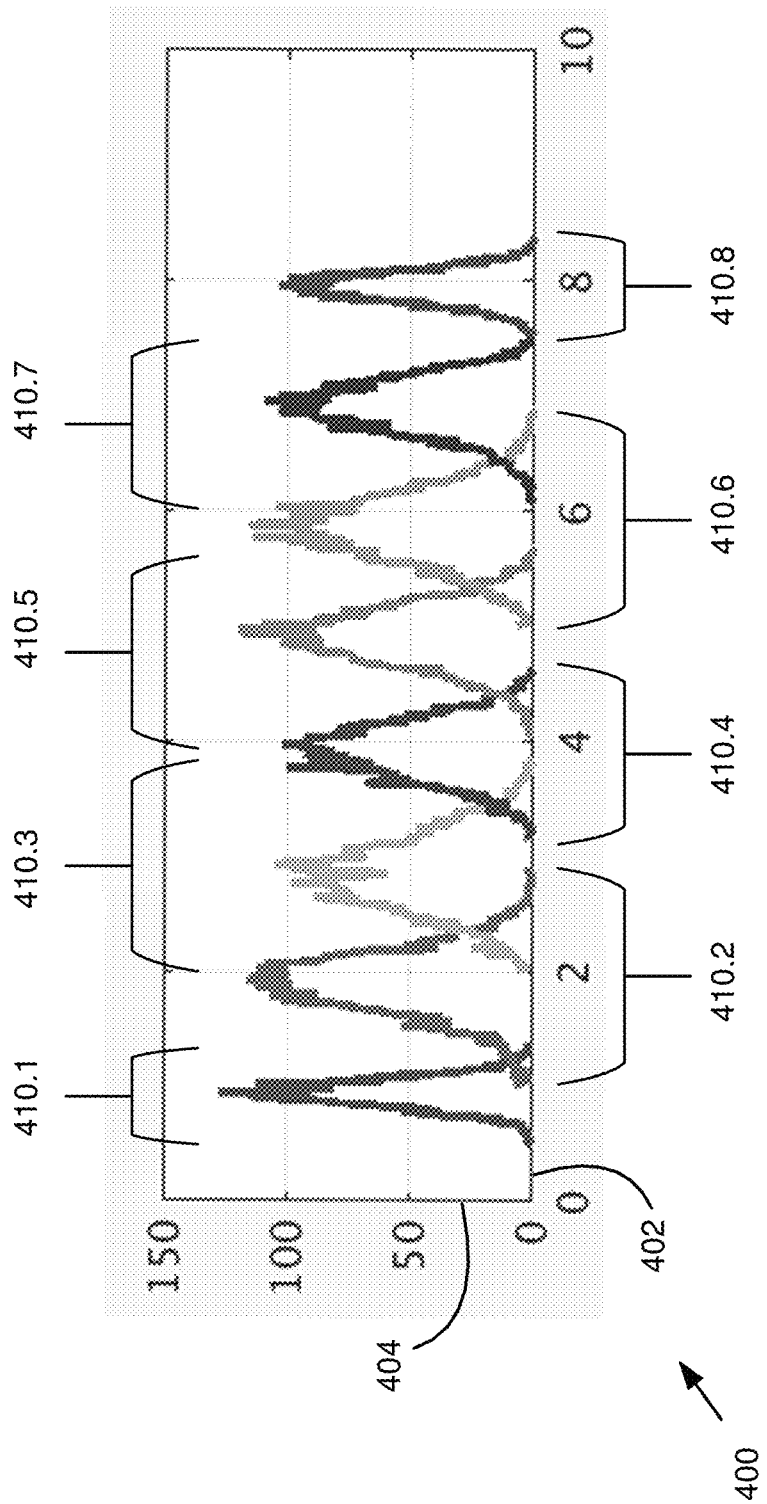
FIG. 4 is a histogram of states for an example three-bit symbol.

After training, the statistics of outputs from the training data may be combined in order to provide a set of probabilities for each state. For example, the output statistics may be used to assemble a histogram 400 of states, as shown in FIG. 4. The X-axis 402 corresponds to the possible states, the 8 states for a 3-bit symbol in this example. The Y-axis 404 corresponds to a magnitude of aggregate outputs from the training data, the scale being determined by the sample size of the training data set. In FIG. 4, the output of the states creates distribution around each of the 8 states, which are local and close to Gaussian. For example, a first distribution 410.1 corresponds to a first state (e.g., 000) in the training data, a second distribution 410.2 corresponds to a second state (e.g., 001), and each additional distribution 410.3-410.8 corresponds to another state (e.g., 010, 100, 110, 101, 011, 111). From this distribution, a probability for each possible output state may be determined and provide soft information output for the ANN detector (histograms of states are offset for convenience). For example, any X value may correspond to one or more states and may be used to calculate the probabilities of the corresponding states, where an X value with a single state value would have a probability of 1 and X values with overlapping state values would have probabilities based on their relative values. At run-time, the probability values for any given symbol sample may be output as probability state values 326.

Figure 5:
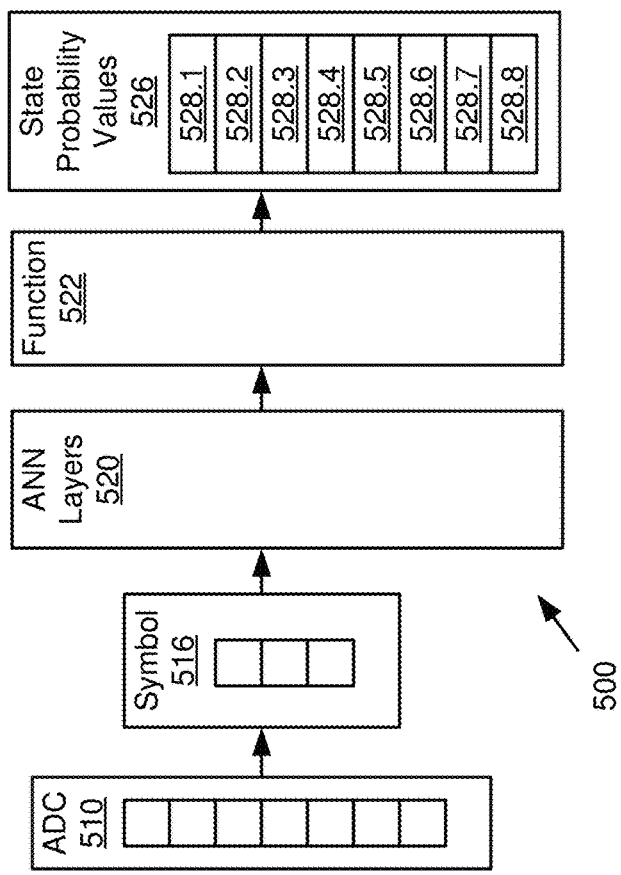
FIG. 5 is a comparison of block diagrams and corresponding histograms for example multilayer artificial neural network detector configurations with different output activation.
Figure 5:
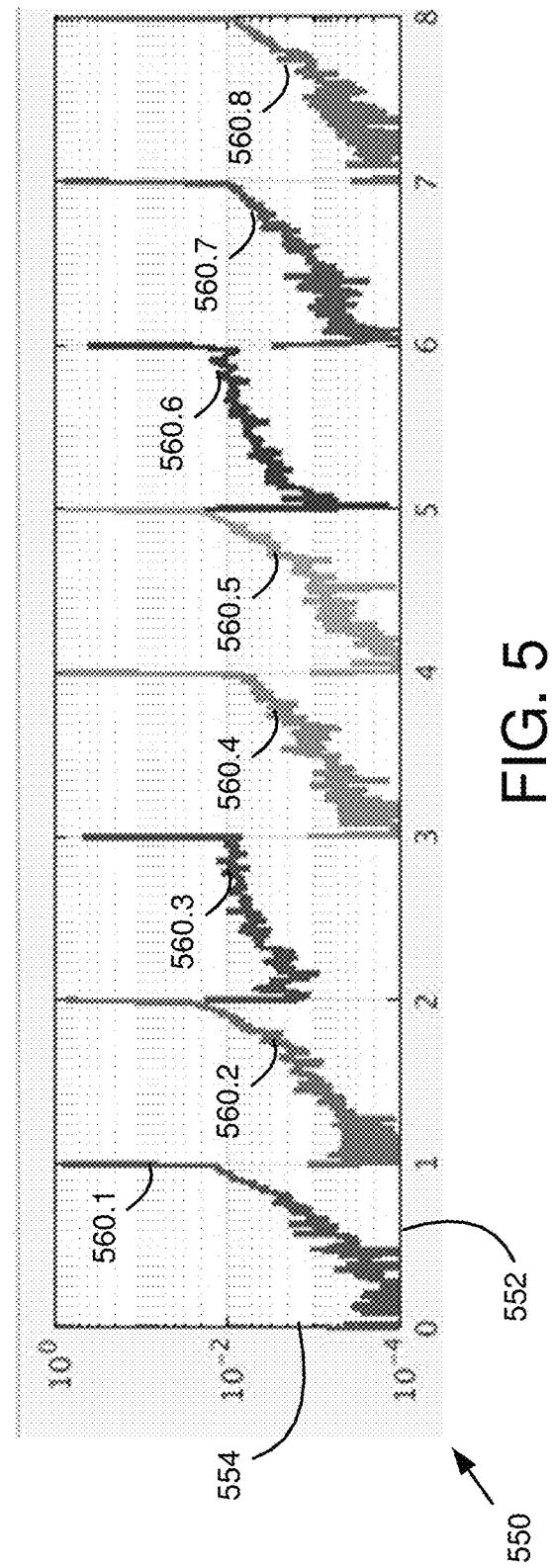

In some examples, an output activation function may be applied to the output from the final FC layer to modify the resulting soft information calculation and probability outputs for the different states. FIG. 5 shows the effect of output activation functions on the quality of soft information. As described above, ANN detector 300 does not include an activation function after final FC layer 324, which allows for wider soft information with a distribution that is closer to gaussian, as shown in histogram 400 in FIG. 4. ANN detector 500 may be configured similarly to ANN detector 300. For example, ADC 510 may provide a set of digital samples corresponding to a window of bits in a data stream, such as 7-bits, 13-bits, or another ADC sampling window. ANN layers 520 may receive these bits to determine a symbol 516 in the middle of ADC 510 sequence. ANN layers 520 may include any number of fully connected layers and/or combination of convolutional kernels and at least one fully connected layer and may include one or more activation functions between FC layers. ANN detector 500 includes an activation function 522 following ANN layers 520, such that the output of the final FC layer is processed through activation function 522. For example, activation function 522 may include a sigmoid activation function.

Histogram 550 shows an example set of states data resulting from a training data set similar to that used for FIG. 4. As in histogram 400, histogram 550 includes an X axis 552 corresponding to the states and a Y axis 554 corresponding to a magnitude, but scaled through the sigmoid activation function. The output of ANN detector 500 includes distributions of state values 560.1-560.8 corresponding to the 8 possible states of a sample symbol. Histogram 550 shows that the output of the sigmoid function may be closer to a "hard decision" with less range in returned probabilities. When the output from ANN detector 504 is used to seed the matrix of a Viterbi coupled probability machine, the "hard probabilities" of the output will be further smoothed by the soft decision processing of the Viterbi. In some configurations, ANN detector 500 may have an advantage of faster training and may outperform ANN detector 300 for some input signals. In some examples, activation functions may be used to regulate or tune tradeoffs related to the softness of the "soft output" from the ANN detector, in order to determine final performance of the read channel.

Figure 6:
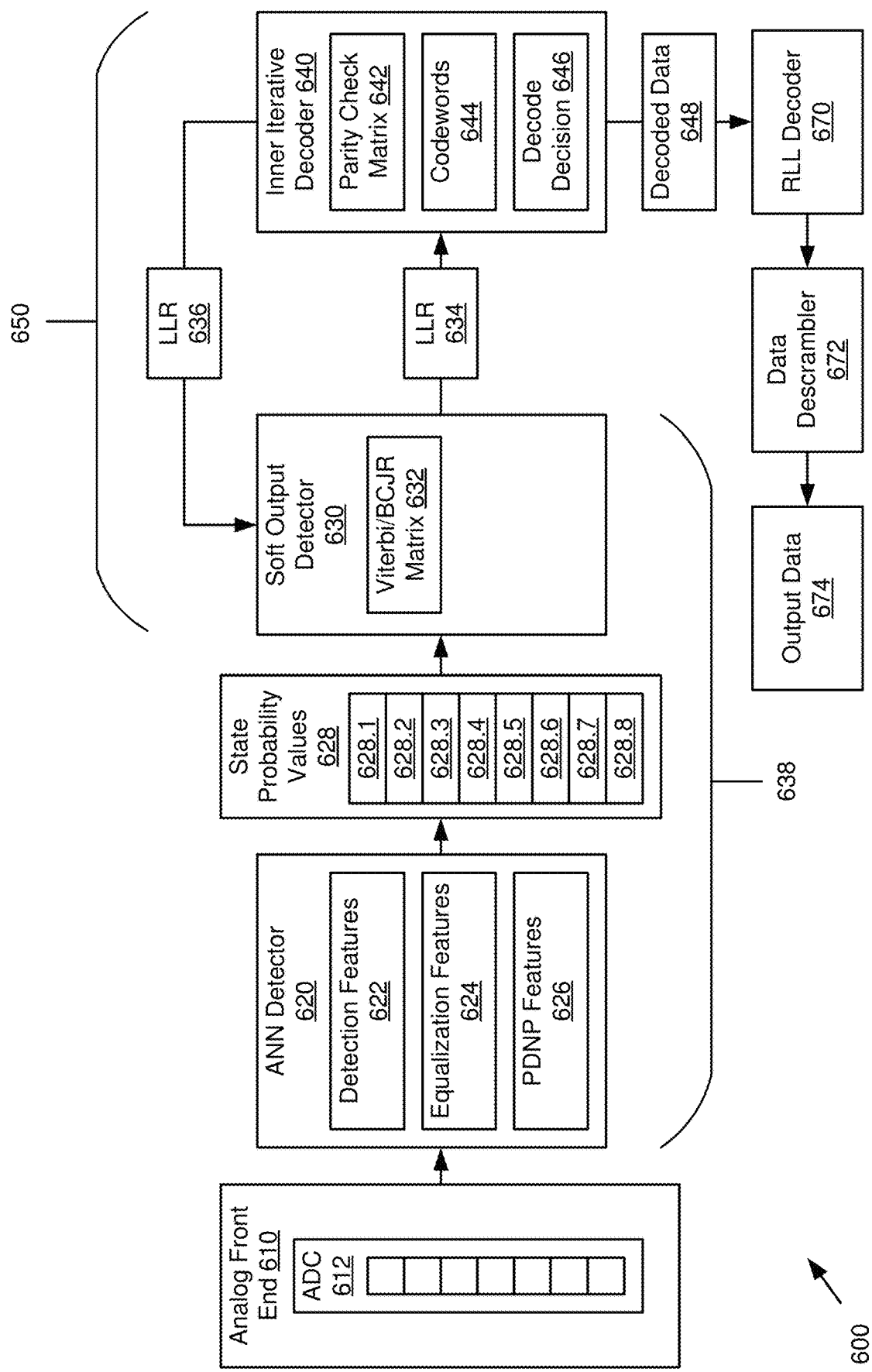
FIG. 6 is a block diagram integrating an example ANN detector into a read path for data processing.

FIG. 6 shows a read channel 600 with an ANN detector 620, such as ANN detector 300 described above with regard to FIG. 3, configured to determine state probabilities for bit detection. In some examples, ANN detector 620 may be incorporated into an otherwise conventional read channel, similar to a read channel embodying read path 250 in FIG. 2. As described above, in some examples, ANN detector 620 may include CNN or RNN features and processing as well. Read channel 600 may include an analog front end 610 including an ADC 612 configured to determine digital representations of an analog bit stream, such as the analog signal generated from reading stored data from NVSM. ADC 612 may be configured similarly to ADC 310 in FIG. 3 and/or ADC 260 in FIG. 2. Analog front end 610 may include other components for preprocessing the analog data signal before it is processed by ADC 260, such as VGA 254, amplitude asymmetry correction 256, and/or CTF 258 from Figured 2. Analog front end 610 and/or ADC 612 may pass digital bit samples from the sample window of ADC 612 to ANN detector 620. The bit samples may correspond to a symbol to be processed by ANN detector 620 and may include a number of bits equal to or less than the sample window of ADC 612.

In the example shown, ANN detector 620 receives 7 bits from analog front end 610 and outputs the state probability values 628 for the 8 possible states of the detected 3-bit symbol in the middle of the 7-bit sequence if ADC 612. As described with regard to FIGS. 3-5, ANN detector 620 may be configured as a series of fully connected layers, activation functions, convolutional kernels, and/or looping constraints trained to determine state probability values 628 from the digital bit samples for the received symbol. State probability values 628, such as state values 628.1-628.8, may initialize the states of Viterbi/BCJR matrix 632 in soft output detector 630 for iterative calculation of the bit LLR values using Viterbi and/or BCJR algorithms. Thus, soft output detector 630 and ANN detector 620 act as a coupled states probability machine 638 to further refine the predicted states from ANN detector 620 into actual bit determinations with associated soft information (e.g., LLR), which can then be refined into codeword determinations through iteration with the LDPC decoder. For simplicity, an example SOYA, BCJR, or other soft output detector 630 may have 8 input states matched to the 8 states output by ANN detector 620, although any number of states of Viterbi could be coupled to any number of states from the ANN detector.

In some examples, ANN detector 620 may support a plurality of features in the neural network logic, as determined by a combination of the layer and node configurations, as well as the weighting coefficients and training data sets. For example, ANN detector 620 may include signal detection features 622 configured to process a plurality of digital samples representing one or more bits in an analog bit stream signal. For example, ADC 612 may determine bit timing windows for each expected bit in the bit stream and provide a plurality of digital values representing signal magnitude during each timing window as a digital bit sample and detection features 622 may determine the most probable bit values for a set of digital bit samples corresponding to the symbol being processed. In some examples, ANN detector 620 may be configured to integrate equalization features 624 and/or PDNP features 626 into its neural network logic, enabling the simplification of other components in the read path. For example, integrating equalization features (training based on unequalized ADC samples) into ANN detector 620 may enable the elimination of separate equalization circuits or functions, such as the removal of equalizer 262 from prior art read channels. By integrating PDNP features into ANN detector 620, soft output detector 630 in iterative decoder 650 may be simplified, managing fewer states. For example, Viterbi/BCJR matrix 632 may be configured for 8 states rather than the 32 states that may be used to handle PDNP. In the example shown, ANN detector 620 combines features 622, 624, and 626 to perform corresponding functions of the soft detector, equalizer, and noise predictor. ANN detector 620 that may be fully integrated in a read channel (such as by replacing components in the read path 250 of FIG. 2).

In the example shown, soft output computation is made based on a histogram (probability) matrix. For example, for the 8-state output of ANN detector 620, the histogram matrix is 8×8. During training, for each input state, histograms of values on each output P(x)[1:state, 1:out] are collected. Based on the collected values, soft output may be defined by computing probability for each state as:

$$p(\text{state\_}i) = \text{prod}(P(x_0)(\text{state\_}i, 1:\text{out}))$$

where, P(x) is the probability output x for the specific state and specific out. State is the input state during training and out is the maximum number of outputs.

In some examples, ANN detector 620 may use an activation function following the final fully connected layer to determine soft output for state probability values 628. For example, a rectifier (relu) or sigmoid function may be used for classification of outputs and softmax layer for determination of soft output. In some examples, a probability density function may provide more accurate state probability values 628, which may be more compatible with iterative detector 650.

After ANN detector 620 fills the probability of states in Viterbi/BCJR matrix 632 of soft output detector 630 for the target data unit (such as a sector, block, page, etc.) or corresponding codeword(s) being decoded, soft output detector 630 may run forward and backward probability propagation, as usual. In some examples, soft output detector 630 may be configured as a coupled probability machine, without any noise predictor support, because the noise predictor features may be in ANN detector 620, as described above. Bit LLR values 634 computed by soft output detector 630 may be passed to an inner iterative decoder 640, such as an LDPC decoder, and extrinsic information as LLR values 636 (e.g., bias values) may be passed back to soft output detector 630 for global iteration of iterative decoder 650. Thus, ANN detector 620 may act as a soft information preprocessor for seeding the probability states of the Viterbi/BCJR matrix in soft output detector 630 and combine with soft output detector 630 and inner iterative decoder 640 as a functional iterative decoder with soft decision-making or soft read channel circuit.

In some examples, inner iterative decoder 640 may be configured as a conventional LDPC decoder or other convolutional code decoder. For example, inner iterative decoder 640 may include a parity check matrix 642 based on the parity encoding configuration used on the write or encoding side of the data storage or transmission configuration. Parity check matrix 642 may be used to implement iterative belief propagation decoding to achieve maximum likelihood determination of the original encoded codewords 644. In some example, soft output detector 630 may provide bit probabilities corresponding to single parity check codes and decoder matrix 642 may perform variable-node processing for iterative constraint satisfaction. More specifically, inner iterative decoder 640 may use parity check matrix 642 to attempt to determine each bit in an unknown codeword 644 based on soft information, such as LLR values 634, received from soft output detector 630. Inner iterative decoder 640 may check constraints and determine the validity of a proposed codeword based on decode conditions to make decode decision 646. For example, inter iterative decoder 640 may determine that the proposed codeword meets all constraints for a valid codeword and provide decoded bit data based on reversing the encoding of the valid codeword. Or, decode decision 646 may determine that not all constraints have been met and further global iterations may enable successful decoding and return soft information, such as LLR values 636, as extrinsic information to soft output detector 630 for one or more bits or symbols, such as corresponding to a particular single parity check code. As described above, this feedback on soft information and iteratively exchanging extrinsic information between inner iterative decoder 640 and soft output detector 630 may provide global iterations to discover previously unknown bit values. Decode decision 646 may also manage conditions where a valid codeword cannot be determined and some form of error handling, such as error notification and/or error recovery, is initiated. Decoded bit data 648 may be generated by iterative decoder 650. For example, iterative decoder 650 may output decoded bit data 648 corresponding to the decoded symbol, codeword, and/or a data unit containing the decoded symbol and/or codeword. In some examples, the decoded bit data 648 may be further processed by read channel 600 before read channel 600 returns output data 674 to the requesting function, memory controller, drive controller, or storage controller of a data storage device in which read channel 600 is incorporated. For example, read channel 600 may include an RLL decoder 670 and/or data descrambler 672 in a read path similar to read path 250 in FIG. 250. Using the ANN detector 620 to preprocess state probabilities and seed the Viterbi/BCJR matrix 632 may result in read channel 600 having BER improvements over using an ANN detector alone to replace iterative soft information detectors and/or iterative decoders.

Figure 7:
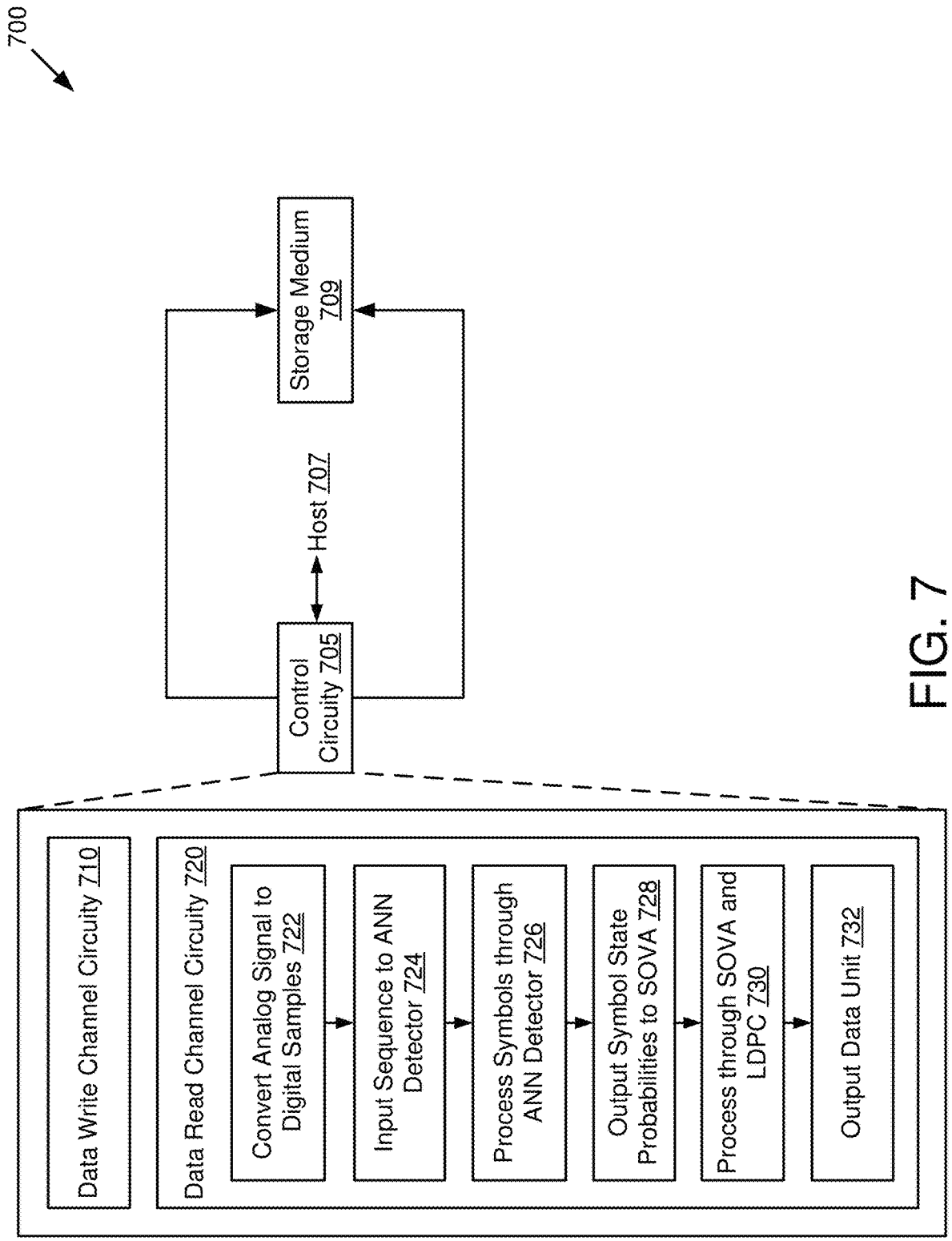
FIG. 7 is an example data storage device incorporating an ANN detector in data read channel circuitry.

FIG. 7 is a block diagram illustrating an example storage system 700 having innovative data processing components. As illustrated, the storage system 700 includes control circuitry 705, a host computing system 707 (may be simply referred as "host"), and a storage medium 709. The storage medium 709 may comprise any suitable storage medium including, but not limited to a hard disk drive (HDD), a solid-state drive (SSD), a flash drive, an optical drive, a tape drive, an older form of drive such as floppy drives, volatile or non-volatile memory, etc.

The host 707 is a computer system or other external system or device to which the storage medium 709 is coupled and/or with which the storage medium 709 is integrated. The storage medium 709 is accessible for data storage and I/O (input/output) operations. For instance, the host 707 may issue commands for data manipulation in the storage medium 709. The control circuitry 705 mediates the communication between the host 707 and the storage medium 709 and provides an interface between the storage medium 709 and a bus connecting it to the rest of the system. For example, control circuitry 705 may be a drive or memory controller of a data storage device. As illustrated in the figure, the control circuitry 705 may include data write channel circuitry 710 for data writing execution and a data read channel circuitry 720 for data reading execution. For example, data write channel circuitry 710 may incorporate elements similar to write path 202 in FIG. 2 and data read channel circuitry 720 may incorporate elements similar to read channel 600 in FIG. 6. In the disclosed examples, the control circuitry 705 may employ machine-learning techniques to improve error rate performance and/or provide data recovery functionality.

When reading data from the storage medium 709, the control circuitry 705 may receive a command signal from the host 707, which instructs the control circuitry 705 to access a certain portion of storage medium 709 (e.g., the locations of blocks on a magnetic disc, in memory, etc. corresponding to a data unit) to be accessed. As a further example, in an embodiment involving an HDD, in response to the command signal, servo electronics within the control circuitry 705 may produce control signals that position a data head over a desired track in the storage drive, which develops a read signal indicative of flux reversals in the track over which the data head is positioned.

An input signal (e.g., the read signal) may, in some cases, be provided to preconditioning logic in the data read channel circuitry 720, which may include a preamplifier, an analog to digital converter (ADC) and/or filtering circuitry, as is described elsewhere herein, such as with reference to FIG. 2. As shown in block 722, the ADC may convert analog signals into digital samples forming a bit sequence. A moving window of the bit sequence may be input to the ANN detector at block 724. The ANN detector may select and process symbols from the bit sequence to determine probabilities for each possible state of the target symbol at block 726. The ANN detector may output the symbol state probabilities to a SOVA (Viterbi detector) to seed the probability states of the Viterbi matrix at block 728. The SOVA may process the probability matrix, generate soft bit predictions for a data unit, and iterate based on LDPC decoding and extrinsic probability feedback at block 730. The decoded data unit may then be output to the host computing system 707 in response to a read command signal received from the host 707.

Figure 8:
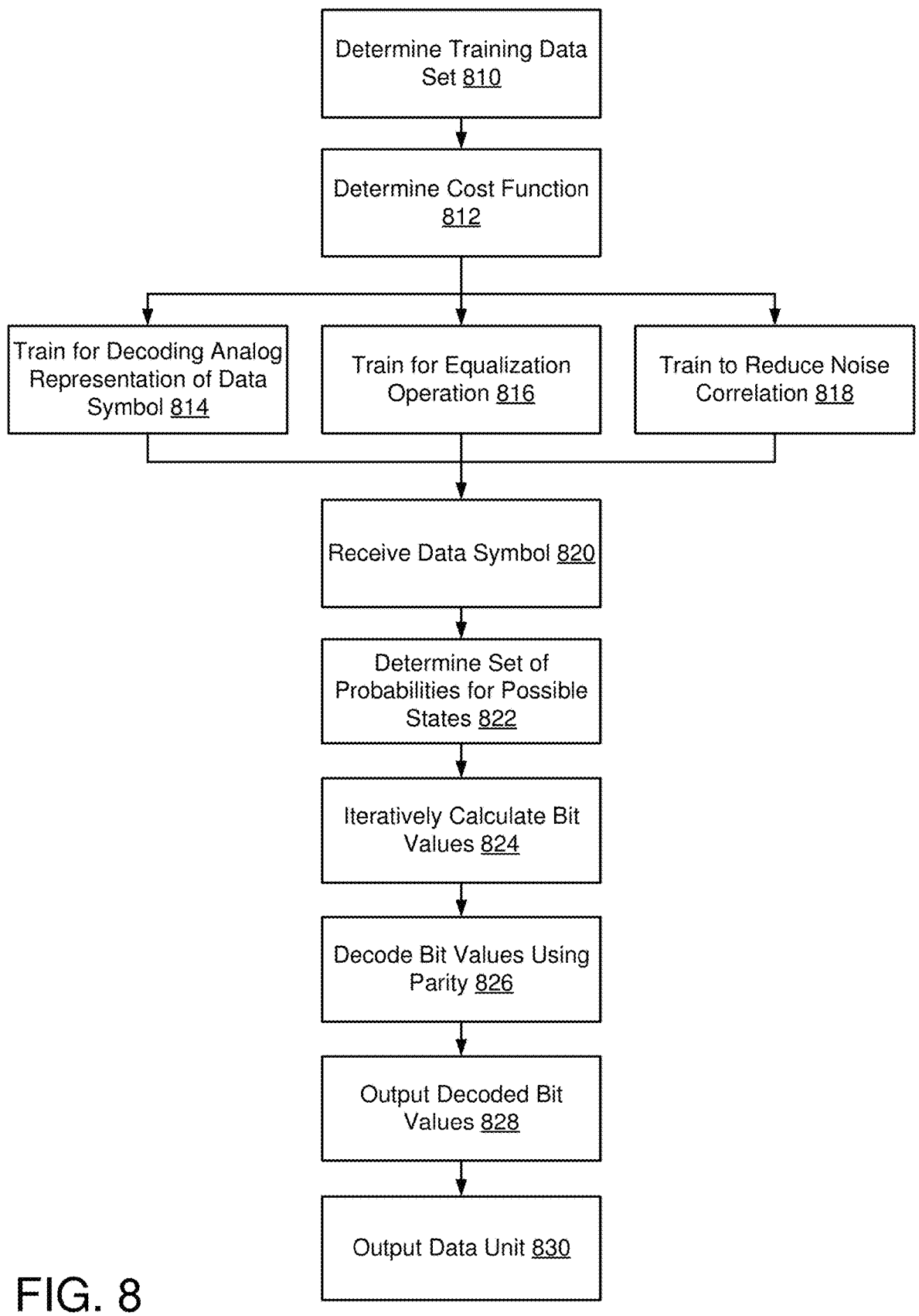
FIG. 8 is an example method of reading bit data from a data signal using an ANN detector incorporated in a read channel.

As shown in FIG. 8, the ANN detector 300 and read channel 600 may be operated according to an example method of reading bit data from a data signal using an ANN detector incorporated in a read channel, i.e., according to the method 800 illustrated by blocks 810-830.

At block 810, a training data set is determined for training the ANN detector for a read channel. For example, the training data set may include a plurality of data symbols corresponding to a variety of read operations representing normal and edge operating conditions. In some examples, the training data set may be generated using the read path of the read channel and the storage medium of the data storage device the read channel operates in.

At block 812, a cost function is determined for training the ANN detector. For example, the cost function may be selected to optimize soft information values generated by the ANN detector, such as a set if probabilities for symbol states.

At blocks 814-818, the ANN detector is trained for a plurality of features. For example, at block 814, the training data set includes analog representations of data symbols that the ANN detector is trained to determine symbol probabilities from. At block 816, the training data set includes symbol samples based on unequalized analog data streams to train the ANN detector to provide equalization operations within the trained detector logic. At block 818, the training data set includes symbol samples that have not been corrected for pattern-dependent noise correlation to train the ANN detector to provide noise compensation within the trained detector logic. After the ANN detector is trained, the read channel may be put into use in a data storage device for production or runtime read operations.

At block 820, a data symbol may be received by the ANN detector as part of a data read operation. For example, an ADC may send the digital sample values corresponding to the analog bits in the symbol to the ANN detector.

At block 822, a set of probabilities for possible states may be determined. For example, the ANN detector may process the symbol data through its trained neural network to determine a probability value for each possible state of the symbol and provide the set of probabilities to an iterative decoder.

At block 824, bit values may be iteratively calculated based on the set of probabilities for possible states. For example, an iterative decoder may use the set of probability to populate a decision matrix and calculations may be generated by iteratively traversing one or more matrices until a valid codeword meeting parity constraints is determined.

At block 826, bit values may be decoded using parity. For example, the iterative decoder may use a codeword of bit values determined at block 824 and corresponding parity bit values and encoding scheme to decode the codeword.

At block 828, the decoded bit values may be output by the iterative decoder. For example, the bit values decoded at block 826 may be output to a next component in the read path of the read channel, such as an RLL decoder.

At block 830, the data unit may be output by the read channel. For example, the decoded bit values may be further processed and output to a read buffer or similar memory structure for reconstructing a target data unit from one or more decoded symbols, codewords, or other subunits, and the target data unit may then be used by the device controller and/or returned to a host.

Figure 9:
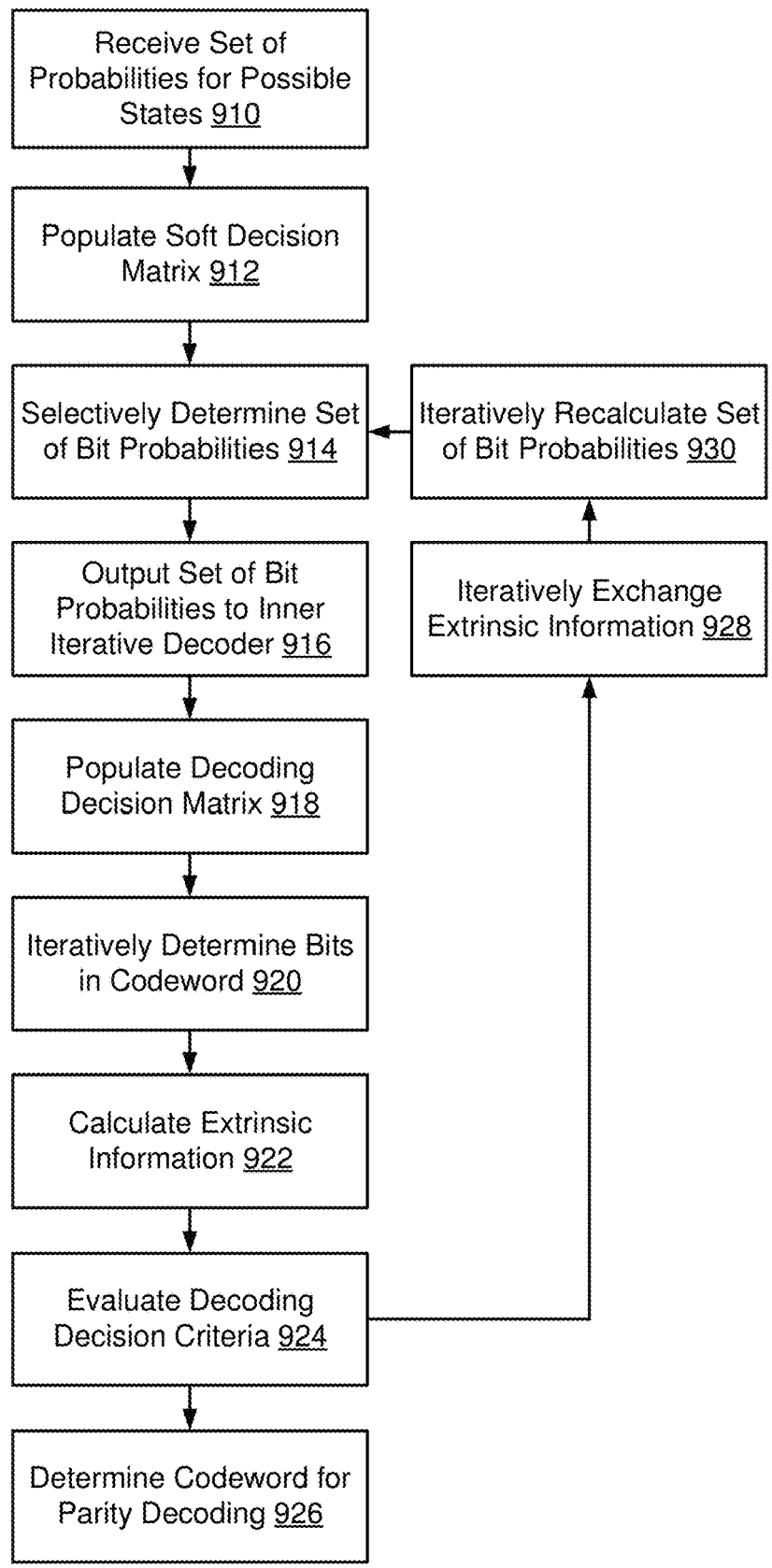
FIG. 9 is an example method of iteratively calculating bit values based on a set of probabilities for possible states.

As shown in FIG. 9, the ANN detector 300 and read channel 600 may be operated according to an example method of iteratively calculating bit values based on a set of probabilities for possible states, i.e., according to the method 900 illustrated by blocks 910-930. In some examples, method 900 may be executed as part of block 824 of method 800 in FIG. 8.

At block 910, a set of probability for possible states of a symbol may be received by a soft output detector. For example, a SOVA or BCJR soft output detector may receive the set of probabilities from an ANN detector.

At block 912, a soft decision matrix may be populated with the set of probabilities for possible states. For example, the soft decision detector may populate a Viterbi or BCJR decision matrix using one or more probability values from the set of probabilities.

At block 914, a set of bit probabilities may be selectively determined. For example, the soft decision detector may process the soft decision matrix to calculate the most likely bit values based on the set of probabilities for possible states, as well as corresponding soft information, such as probability values (e.g., LLR values) for each bit.

At block 916, the set of bit probabilities may be output by the soft decision detector to an inner iterative decoder. For example, the soft decision detector may pass the LLR values to the inner iterative decoder within the iterative decoder.

At block 918, a decoding decision matrix may be populated based on the set of bit probabilities received. For example, the inner iterative decoder may populate an LDPC decision matrix with the LLR values received from the soft output detector. In some examples, the decoding decision matrix may be larger than the set of probability values from a single symbol and blocks 910-918 may be executed for multiple symbols to populate the decoding decision matrix before processing that matrix.

At block 920, the bits in a codeword may be iteratively determined. For example, the inner iterative decoder may process the decoding decision matrix to propagate values and calculate a most likely pattern of bits corresponding to a valid codeword.

At block 922, extrinsic information values may be calculated. For example, the inner iterative decoder may determine LLR values for the bits in the codeword that may be passed back to the soft information detector as extrinsic information if iterations are needed.

At block 924, decoding decision criteria may be evaluated. For example, the iterative decoder may include decision criteria to determine whether a valid codeword has been determined to meet a reliability threshold, whether further global iterations are needed, or whether an error condition has been met (e.g., corresponding to an unrecoverable data error). If a valid codeword has been determined, method 900 may proceed to block 926. If a valid codeword has not yet been determined and additional iterations are needed, method 900 may proceed to block 928. No block is shown in FIG. 9 for error conditions.

At block 926, the codeword may be determined for parity decoding. For example, the valid codeword determined at block 920 and validated at block 824 may be used to recover the encoded data bits using the parity values and encoding, resulting in decoded bit data without parity values.

At block 928, extrinsic information is iteratively exchanged between the soft decision detector and the inner iterative decoder. For example, in each global iteration, the inner iterative decoder may pass LLR values to the soft decision detector and the soft decision detector may pass updated LLR values to the inner iterative decoder.

At block 930, the set of bit probabilities may be iteratively recalculated using the extrinsic information from the inner iterative decoder. For example, the soft decision detector may use the LLR values received as extrinsic information to recalculate the soft decision matrix values for selectively determining the set of bit probabilities (at block 914) for the next global iteration through the iterative decoder.

Technology for improved read channel data detection using ML algorithms is described above. In the above description, for purposes of explanation, numerous specific details were set forth. It will be apparent, however, that the disclosed technologies can be practiced without any given subset of these specific details. In other instances, structures and devices are shown in block diagram form. For example, the disclosed technologies are described in some implementations above with reference to particular hardware.

Reference in the specification to "one embodiment" or "an embodiment" means that a particular feature, structure, or characteristic described in connection with the embodiment is included in at least one embodiment or implementation of the disclosed technologies. The appearances of the phrase "in one embodiment" in various places in the specification are not necessarily all referring to the same embodiment or implementation.

Some portions of the detailed descriptions above may be presented in terms of processes and symbolic representations of operations on data bits within a computer memory. A process can generally be considered a self-consistent sequence of operations leading to a result. The operations may involve physical manipulations of physical quantities. These quantities take the form of electrical or magnetic signals capable of being stored, transferred, combined, compared, and otherwise manipulated. These signals may be referred to as being in the form of bits, values, elements, symbols, characters, terms, numbers, or the like.

These and similar terms can be associated with the appropriate physical quantities and can be considered labels applied to these quantities. Unless specifically stated otherwise as apparent from the prior discussion, it is appreciated that throughout the description, discussions utilizing terms for example "processing" or "computing" or "calculating" or "determining" or "displaying" or the like, may refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The disclosed technologies may also relate to an apparatus for performing the operations herein. This apparatus may be specially constructed for the required purposes, or it may include a general-purpose computer selectively activated or reconfigured by a computer program stored in the computer. Such a computer program may be stored in a computer readable storage medium, for example, but is not limited to, any type of disk including floppy disks, optical disks, CD-ROMs, and magnetic disks, read-only memories (ROMs), random access memories (RAMs), erasable programmable read-only memories (EPROMs), electrically erasable programmable read-only memories (EEPROMs), magnetic or optical cards, flash memories including USB keys with non-volatile memory or any type of media suitable for storing electronic instructions, each coupled to a computer system bus.

The disclosed technologies can take the form of an entire hardware implementation, an entire software implementation or an implementation containing both hardware and software elements. In some implementations, the technology is implemented in software, which includes but is not limited to firmware, resident software, microcode, etc.

Furthermore, the disclosed technologies can take the form of a computer program product accessible from a non-transitory computer-usable or computer-readable medium providing program code for use by or in connection with a computer or any instruction execution system. For the purposes of this description, a computer-usable or computer-readable medium can be any apparatus that can contain, store, communicate, propagate, or transport the program for use by or in connection with the instruction execution system, apparatus, or device.

A computing system or data processing system suitable for storing and/or executing program code will include at least one processor (e.g., a hardware processor) coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modems, and Ethernet cards are just a few of the currently available types of network adapters.

The terms storage media, storage device, and data blocks are used interchangeably throughout the present disclosure to refer to the physical media upon which the data is stored.

Finally, the processes and displays presented herein may not be inherently related to any particular computer or other apparatus. Various general-purpose systems may be used with programs in accordance with the teachings herein, or it may prove convenient to construct more specialized apparatus to perform the required method operations. The required structure for a variety of these systems will appear from the description above. In addition, the disclosed technologies were not described with reference to any particular programming language. It will be appreciated that a variety of programming languages may be used to implement the teachings of the technologies as described herein.

The foregoing description of the implementations of the present techniques and technologies has been presented for the purposes of illustration and description. It is not intended to be exhaustive or to limit the present techniques and technologies to the precise form disclosed. Many modifications and variations are possible in light of the above teaching. It is intended that the scope of the present techniques and technologies be limited not by this detailed description. The present techniques and technologies may be implemented in other specific forms without departing from the spirit or essential characteristics thereof. Likewise, the particular naming and division of the modules, routines, features, attributes, methodologies and other aspects are not mandatory or significant, and the mechanisms that implement the present techniques and technologies or its features may have different names, divisions and/or formats. Furthermore, the modules, routines, features, attributes, methodologies and other aspects of the present technology can be implemented as software, hardware, firmware or any combination of the three. Also, wherever a component, an example of which is a module, is implemented as software, the component can be implemented as a standalone program, as part of a larger program, as a plurality of separate programs, as a statically or dynamically linked library, as a kernel loadable module, as a device driver, and/or in every and any other way known now or in the future in computer programming. Additionally, the present techniques and technologies are in no way limited to implementation in any specific programming language, or for any specific operating system or environment. Accordingly, the disclosure of the present techniques and technologies is intended to be illustrative, but not limiting.

What is claimed is:

1. A read channel circuit, comprising:
a neural network detector configured to:
receive a data symbol, wherein the data symbol includes a plurality of unknown bits;
determine a set of probabilities for possible states of the data symbol; and
output the set of probabilities for possible states of the data symbol;
a soft output detector configured to:
receive the set of probabilities for possible states of the data symbol to populate a decision matrix; and
output, based on the decision matrix, a set of bit probabilities for bits of a data unit that includes the data symbol; and
an iterative decoder configured to:
iteratively calculate, based on feedback of soft information, bit values based on the set of bit probabilities for the bits of the data unit; and
output decoded bit values for the data unit that includes the data symbol.

2. The read channel circuit of claim 1, wherein the neural network detector includes a plurality of weight coefficients trained to decode an analog representation of the data symbol.

3. The read channel circuit of claim 1, wherein the neural network detector includes a plurality of weight coefficients trained to perform at least one equalization operation on an analog representation of the data symbol.

4. The read channel circuit of claim 1, wherein the neural network detector includes a plurality of weight coefficients trained to reduce noise correlation in an analog representation of the data symbol.

5. The read channel circuit of claim 1, wherein the neural network detector is selected from:
   a fully connected artificial neural network comprising at least two fully connected layers;
   a convolutional neural network comprising:
      a plurality of convolutional kernels; and
      a fully connected layer; and
   a recurrent neural network comprising:
      a plurality of recurrent network kernels; and
      a fully connected layer.

6. The read channel circuit of claim 1, wherein the neural network detector comprises:
   a plurality of fully connected layers; and
   at least one rectifier activation function positioned between adjacent fully connected layers of the plurality of fully connected layers.

7. The read channel circuit of claim 1, wherein the neural network detector comprises an output layer configured to output a number of probabilities for possible states equal to all possible states for the data symbol.

8. The read channel circuit of claim 1, wherein:
   the soft output detector is further configured to:
      support iterations of the iterative decoder;
      selectively determine, based on the set of probabilities for possible states of the data symbol, the set of bit probabilities for bits of the data unit that includes the data symbol; and
      iteratively exchange extrinsic information with the iterative decoder to provide feedback on soft information; and
   the iterative decoder is further configured to determine whether a decoding decision is reached.

9. The read channel circuit of claim 8, wherein:
   the soft output detector is configured as a states probability machine for the neural network detector;
   the soft output detector implements an algorithm selected from:
      a soft output Viterbi algorithm; and
      a BCJR algorithm; and
   the iterative decoder implements low-density parity check codes.

10. The read channel circuit of claim 8, wherein the soft output detector is further configured to
   iteratively calculate, based on the extrinsic information from the iterative decoder, the set of bit probabilities.

11. The read channel circuit of claim 8, wherein the iterative decoder is further configured to decode at least one codeword using the received set of bit probabilities.

12. A data storage device comprising the read channel circuit of claim 1.

13. A method comprising:
   receiving, by a neural network detector, a data symbol, wherein the data symbol includes a plurality of unknown bits;
   determining, by the neural network detector, a set of probabilities for possible states of the data symbol;
   populating, by a soft output detector, a decision matrix using the set of probabilities for possible states of the data symbol from the neural network detector;
   determining, based on the decision matrix, a set of bit probabilities for bits of a data unit that includes the data symbol;
   iteratively calculating, by an iterative decoder and based on feedback of soft information, bit values from the set of bit probabilities for the bits of the data unit; and
   outputting, by the iterative decoder, decoded bit values for the data unit that includes the data symbol.

14. The method of claim 13, further comprising:
   training the neural network detector to decode an analog representation of the data symbol.

15. The method of claim 13, further comprising:
   training the neural network detector to perform at least one equalization operation on an analog representation of the data symbol.

16. The method of claim 13, further comprising:
   training the neural network detector to reduce noise correlation in an analog representation of the data symbol.

17. The method of claim 13, further comprising:
   receiving, by the soft output detector and from the neural network detector, the set of probabilities for possible states of the data symbol;
   selectively determining, by the soft output detector, the set of bit probabilities for the bits of the data unit over a plurality of iterations;
   providing the set of bit probabilities to the iterative decoder;
   iteratively exchanging, between the soft output detector and the iterative decoder, extrinsic information to provide feedback on soft information; and
   determining, by the iterative decoder, whether a decoding decision is reached.

18. The method of claim 17, further comprising:
   iteratively calculating, by the soft output detector and based on the extrinsic information from the iterative decoder, the set of bit probabilities.

19. The method of claim 13, wherein the soft output detector is configured as a states probability machine for the neural network detector.

20. The method of claim 13, further comprising:
   outputting, by the neural network detector, the set of probabilities for possible states of the data symbol, wherein a number of probabilities in the set of probabilities for possible states of the data symbol is equal to a number of probabilities for all possible states for the data symbol.

21. The method of claim 13, further comprising:
   decoding, by the iterative decoder, at least one codeword using the received set of bit probabilities.

22. A read channel circuit, comprising:
   means for:
      receiving a signal corresponding to a data symbol, wherein the data symbol includes a plurality of unknown bits;
      determining, based on a plurality of trained weight coefficients, a set of probabilities for possible states of the data symbol; and
      outputting a signal corresponding to the set of probabilities for possible states of the data symbol;
   means for:
      populating a decision matrix using the signal corresponding to the set of probabilities for possible states of the data symbol;
      determining, based on the decision matrix, a set of bit probabilities for bits of a data unit that includes the data symbol; and
      outputting a signal corresponding to the set of bit probabilities for the bits of the data unit; and
   means for:
      iteratively calculating, based on feedback of soft information, bit values from the signal corresponding to the set of bit probabilities for the bits of the data unit; and outputting a signal corresponding to decoded bit values for the data unit that includes the data symbol.

\* \* \* \* \*